United States Patent
Sigalas et al.

(10) Patent No.: US 7,907,654 B2
(45) Date of Patent: Mar. 15, 2011

(54) LASER DIODE WITH A GRATING LAYER

(75) Inventors: Mihail (Mike) Sigalas, Santa Clara, CA (US); David A. Fattal, Mountain View, CA (US); Shih-Yuan (SY) Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 272 days.

(21) Appl. No.: 11/796,324

(22) Filed: Apr. 27, 2007

(65) Prior Publication Data

US 2008/0267236 A1 Oct. 30, 2008

(51) Int. Cl.
*H01S 5/00* (2006.01)
*H01S 3/08* (2006.01)

(52) U.S. Cl. ........ 372/50.124; 372/92; 372/98; 372/102

(58) Field of Classification Search .............. 372/92, 372/102, 50.124, 98
See application file for complete search history.

(56) References Cited

U.S. PATENT DOCUMENTS

| | | | |
|---|---|---|---|
| 5,448,581 A * | 9/1995 | Wu et al. | 372/45.01 |
| 5,617,436 A * | 4/1997 | Lo | 372/45.011 |
| 5,896,408 A | 4/1999 | Corzine et al. | |
| 5,970,081 A * | 10/1999 | Hirayama et al. | 372/96 |
| 6,219,369 B1 | 4/2001 | Portnoi et al. | |
| 6,504,180 B1 * | 1/2003 | Heremans et al. | 257/98 |
| 6,658,040 B1 | 12/2003 | Hu et al. | |
| 6,785,320 B1 * | 8/2004 | Amos et al. | 372/102 |
| 6,979,582 B2 | 12/2005 | Horng et al. | |
| 7,122,446 B2 | 10/2006 | Nitta et al. | |
| 7,194,016 B2 | 3/2007 | Bullington et al. | |
| 7,333,522 B2 * | 2/2008 | Ostermann et al. | 372/45.01 |
| 2003/0152125 A1 * | 8/2003 | Kinoshita | 372/96 |
| 2004/0252741 A1 * | 12/2004 | Meyer et al. | 372/67 |
| 2007/0028695 A1 * | 2/2007 | Suzuki et al. | 73/655 |
| 2007/0036189 A1 * | 2/2007 | Hori et al. | 372/50.11 |
| 2007/0201527 A1 * | 8/2007 | Hori et al. | 372/50.124 |

* cited by examiner

*Primary Examiner* — Minsun Harvey
*Assistant Examiner* — Phillip Nguyen

(57) ABSTRACT

A laser diode is provided comprising a multiple quantum well structure, a current concentrating layer having an oxide-confined aperture, a grating layer having an index of refraction, and a transparent electrode, wherein the transparent electrode has an index of refraction less than the index of refraction of the grating layer.

17 Claims, 2 Drawing Sheets

LASER DIODE WITH A GRATING LAYER

BACKGROUND

The present invention relates generally to laser diodes. More particularly, the present invention relates to a novel vertical cavity surface emitting laser. Semiconductor laser diodes were originally fabricated in a manner that provides an optical cavity formed parallel to the surface of the semiconductor wafer. In this structure, light is emitted from the edge of the wafer. Unfortunately, this structure does not lend itself to low cost mass manufacturing or to the cost-effective fabrication of two-dimensional arrays of laser-diodes.

A class of laser diodes can be fabricated such that the optical cavity is formed perpendicular to the surface of the semiconductor wafer, and the light is emitted perpendicular to the surface. Commonly referred to as vertical cavity surface emitting laser diodes (VCSELs), the laser diode consists of an active region which emits light, and surrounding reflective surfaces constructed from alternating layers of materials which direct light to an extraction point on the diode. These diodes are better suited for the fabrication of arrays of lasers for displays, light sources, optical scanners, and optical fiber data links.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENT(S)

Figure 1:
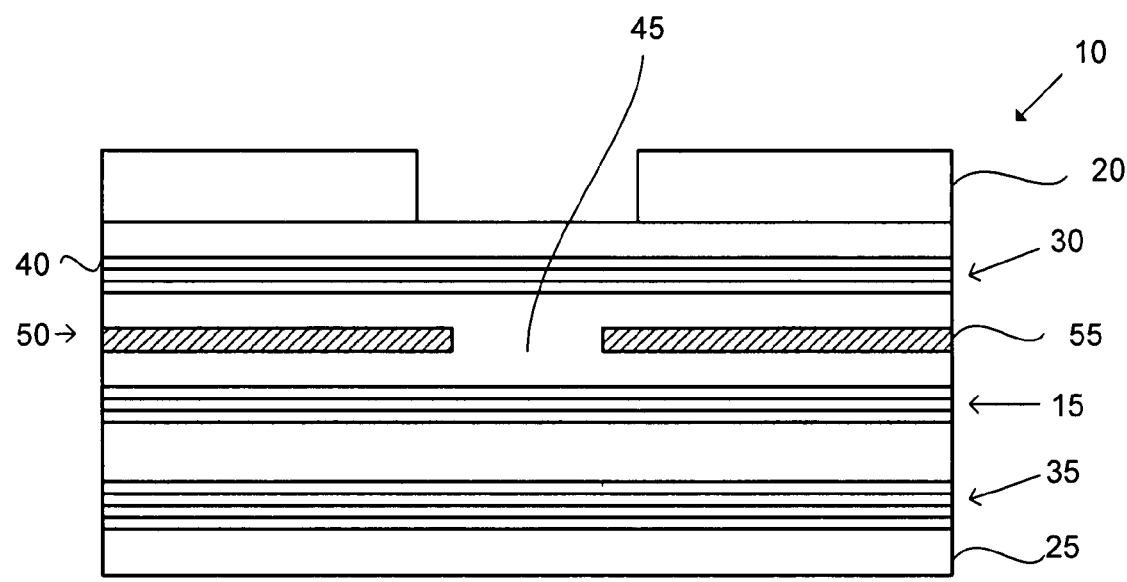
FIG. 1 is a side cross-section view of one example of a laser diode.
Figure 2:
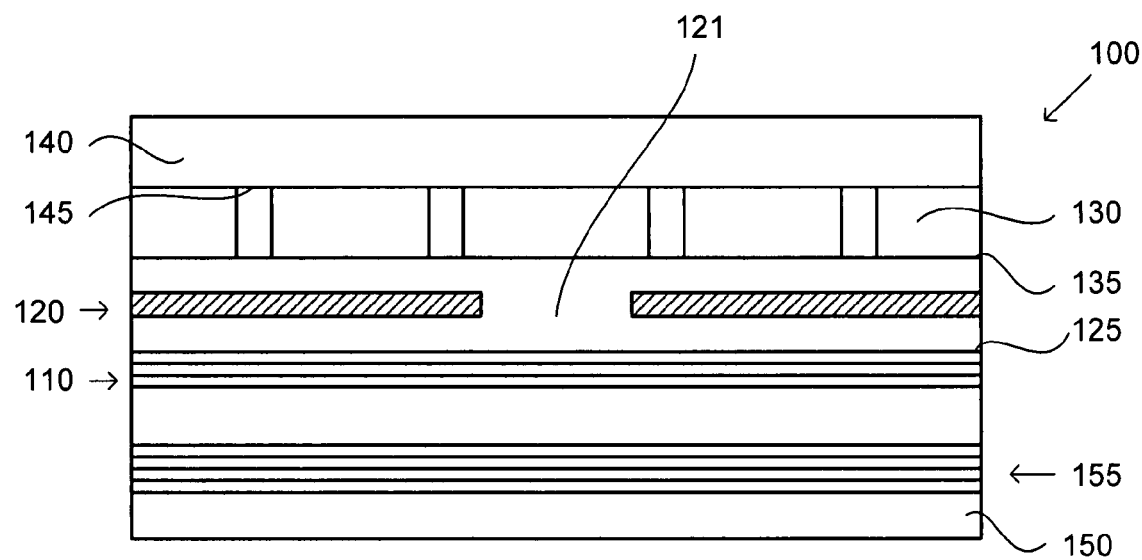
FIG. 2 is a side cross-section view of another example of a laser diode according to one embodiment of the present invention.
Figure 3:
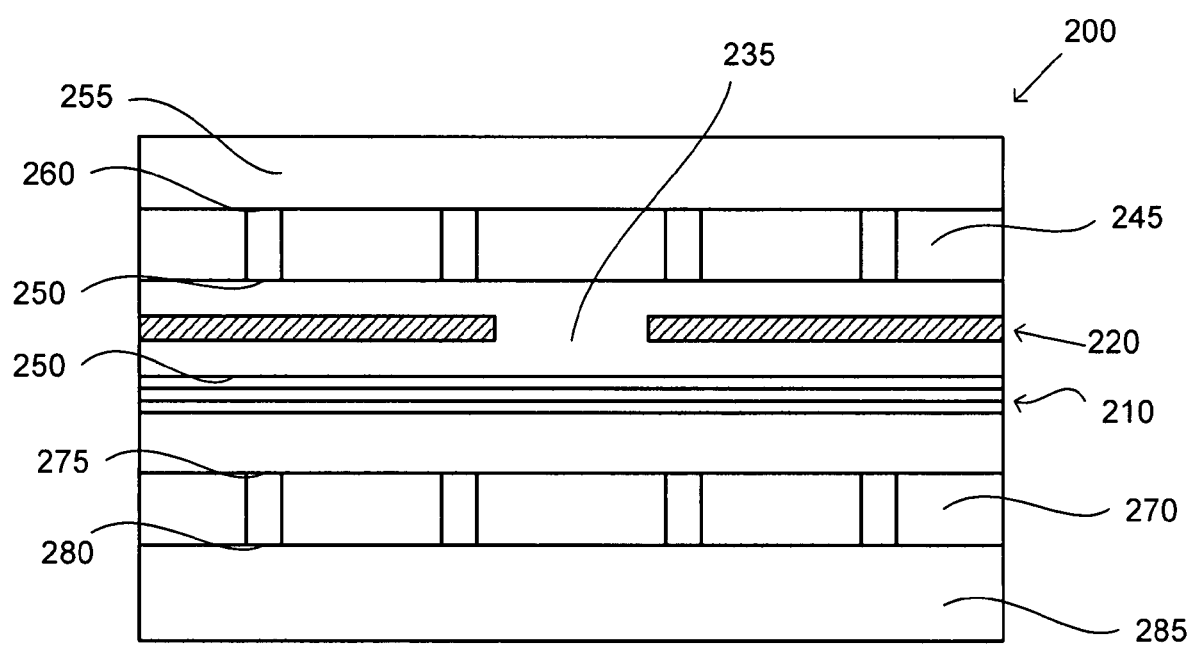
FIG. 3 is a side cross-section view of another embodiment of a laser diode according to the present invention.

The following detailed description of exemplary embodiments of the invention makes reference to the accompanying drawings, which form a part hereof, and in which are shown, by way of illustration, exemplary embodiments in which the invention may be practiced. Thus, the following more detailed description of the embodiments of the present invention, as represented in FIGS. 1 through 3, is not intended to limit the scope of the invention, as claimed, but is presented for purposes of illustration and to sufficiently enable one skilled in the art to practice the invention. Accordingly, the scope of the present invention is to be defined solely by the appended claims.

The present invention may be more easily understood with reference to FIG. 1, which is a side cross-section view of one example of a laser diode 10. As shown in FIG. 1, the laser diode 10 is constructed having a substrate on which a series of layers is applied including a p material of relatively low electron presence and an n material having a relative high electron presence. The p an n layers define an active layer 15, referred to herein also as a quantum well structure, at their interface. By way of example, the active layer 15 may be constructed from one or more quantum wells of gallium arsenide (GaAs), aluminum gallium arsenide AlGaAs, gallium indium phosphorus (GaInP), gallium indium aresenium phosphorus (GaInAsP), or indium aluminum gallium arsenide (InAlGaAs), however, the choice of material depends on the desired wavelength of light to be emitted by the laser diode 10. Electrical power is applied between electrodes 20 and 25 creating a current flow across the active layer 15 resulting in an electron population inversion which generates energy in the form of photons.

In order to sustain and enhance the population, the laser diode 10 may also include a top reflective region 30 and a bottom reflective region 35. The reflective regions 30, 35 are constructed from alternating layers of mirrors 40 (from about 20 to about 30 mirrors, for example) with different indices of refraction. In one aspect, the thickness of each reflective region 30, 35 is about one quarter of the wavelength of the light within each layer. The stacks form a structure known as a distributed Bragg reflector (DBR) mirror structure which is typically 2 to 3 micrometers thick. To obtain the desired reflectivity, multiple pairs of layers are required. In one example, the layers in the top reflective region 30 are doped to be p-type semiconductors, those in the bottom reflective region 35 are doped to be n-type semiconductors.

The current flow between electrodes 20 and 25, is confined to aperture 45 by an insulating region 50 produced by an oxidizable layer 55. In one aspect of the invention, the oxidizable layer 55 is an aluminum containing material that includes, but is not limited to, aluminum gallium arsenide (AlGaAs), aluminum indium arsenide (AlInAs), and aluminum gallium antimony (AlGaSb). Methods of using oxidizable confined apertures and other insulating layers with laser diodes is disclosed in U.S. Pat. No. 5,896,406 to Corzine et al. which is incorporated herein by reference in its entirety.

Referring now to FIG. 2, in one embodiment of the present invention, a laser diode 100 comprises a multiple quantum well structure 110 with a current concentrating layer 120 having an oxide-confined aperture 121. The current concentrating layer 120 is disposed adjacent a top surface 125 of the multiple quantum well structure 110. A grating layer 130 having a predetermined index of refraction is disposed adjacent a top surface 135 of the current concentrating layer 120. The grating layer 130 processes photons emitted from the multiple quantum well structure 110. In one aspect of the present invention, the grating layer 130 ranges from about 0.9 to about 1.5 micrometers thick.

In one embodiment, the grating layer 130 comprises a material having a plurality of fine, equally spaced grooves disposed thereon, referred to herein as a diffraction grating. Typically, the diffraction grating separates an incident polychromatic beam into its constituent wavelength components (i.e., it is dispersive). Each wavelength of input beam spectrum is sent into a different direction, producing a rainbow of colors under white light illumination. However, by controlling the cross-sectional profile of the grooves, the diffraction grating concentrates most of the diffracted energy (from, for example, photons) in a particular order for a given wavelength to form a laser emission.

In another embodiment, the grating layer 130 comprises a material of a specified thickness which is transparent to incident wave energy (e.g., photons) including a given wavelength. Additional grating layers are also contemplated for use with embodiments of the present invention including, but without limitation, amplitude gratings, phase gratings, polarizers, dichroic mirrors, or any combination of gratings capable of directing photon energy from a quantum well at a specific wavelength in the form of a laser emission.

A transparent electrode 140 is disposed adjacent a top surface 145 of the grating layer 130. As current passes through the transparent electrode 140 and a non-transparent bottom electrode 150, photons are emitted from the active layer 110. Photons are reflected off of a bottom reflective region 155 and pass through the grating layer 130 and the transparent electrode 140 as a laser. By way of example, the transparent electrode 140 can be made of material such as indium tin oxide, indium titanium oxide, and aluminum zinc oxide. However, it should be understood that the transparent electrode 140 can comprise any transparent material capable of conducting current and having an index of refraction which is less than the index of refraction of the grating layer 130. For example, in one aspect, the grating layer 130 has an index of refraction from about 2.9 to about 3.5 and the transparent electrode 140 has an index of refraction from about 1.8 to about 2.3. In one embodiment, the index of refraction of the grating layer 130 and the transparent electrode 140 may be linear. Alternatively, the grating layer 130 and the transparent electrode 140 may be constructed to have a non-linear index of refraction.

Advantageously, replacing the DBR mirror structure 30 and nontransparent electrode 20 with the grating layer 130 and transparent electrode 140 assembly, provides for a more compact design of the laser diode 100. As a result, the laser diode 100 requires less applied current to operate and facilitates the construction of more diodes in the same amount of space.

Referring now to FIG. 3, in one embodiment of the present invention, a laser diode 200, similar to the diode presented in FIG. 2, comprises a multiple quantum well structure 210 with a current concentrating layer 220 having an insulating region and oxide-confined aperture 235. The current concentrating layer 230 is disposed adjacent a top surface 240 of the multiple quantum well structure 210. A first grating layer 245 having a predetermined index of refraction is disposed adjacent a top surface 250 of the current concentrating layer 230. A first transparent electrode 255 is disposed adjacent a top surface 260 of the first grating layer 245. A second grating layer 270 is disposed adjacent a bottom surface 275 of the multiple quantum well structure 210. A second transparent electrode 285 is disposed adjacent a bottom surface 280 of the second grating layer 270.

Advantageously, replacing the DBR mirror structures 30, 35 and nontransparent electrodes 20, 25 with the first and second grating layers 245, 270 and transparent electrodes 255, 285, respectively, provides for a more compact design of the laser diode 200. As a result, the laser diode 200 requires less applied current to operate at optimal capacities and facilitates the construction of more diodes in the same amount of space.

The present invention also contemplates a method of making a laser diode. Referring generally to FIGS. 2 and 3, in one embodiment, a laser diode 100 may be made comprising the steps of providing a first layer constructed of a substrate and applying a second layer disposed adjacent to the substrate, wherein the second layer is constructed of a material whose atomic structure is characterized by an excess of electrons. Thereafter, the laser diode may further be constructed by applying a third layer to the second layer, wherein the third layer is constructed of a material whose atomic structure is characterized by a relative absence of electrons. The interface of the second and third layers forms an active layer 110. Upon application of an electric potential to the laser diode 100, energy is generated in the form of photons by the migration of electrons from the second layer to the third layer. Further, a fourth layer 120 is applied to the third layer, wherein the fourth layer comprises a surface having an electrical current resisting material and an aperture 121 disposed thereon for concentrating the electric potential. A first grating layer 130 is thereafter applied to a top surface 135 of the fourth layer 120 and a transparent electrode 140 is applied to a top surface 145 of the grating layer 130. The transparent electrode 140 has an index of refraction less than the index of refraction of the first grating layer 130.

In another embodiment, the method of manufacturing a laser diode 200 further comprises the step of applying a second grating layer 270 to a bottom surface 275 of the active layer 210 and a second transparent electrode 285 to a bottom surface 280 of the second grating layer 270. The second transparent electrode 285 has an index of refraction less than the index of refraction of the second grating layer 270.

Summarizing and reiterating to some extent, benefits of the present invention include a more compact, energy efficient laser diode. Various embodiments of the laser diode are suitable for use with different types of optical, electrical and other applications. The more compact, energy efficient diode is achieved by replacing the conventional top and/or bottom reflective layers of a laser diode with a grating layer and the electrodes of a conventional laser diode with a transparent electrode. This allows the laser diode to function as required by electrical and other devices with less applied current and in a more compact space. Moreover, this may allow the direction of the laser emission to be adjustable depending on the particular design of the grating layer.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A vertical cavity surface emitting laser diode, comprising
    a multiple quantum well structure;
    a current concentrating layer having an oxide-confined aperture, the current concentrating layer being disposed adjacent a top surface of the multiple quantum well structure;
    a grating layer having an index of refraction and a specified thickness, the grating layer disposed adjacent a top surface of the current concentrating layer;
    a transparent electrode disposed adjacent a top surface of the grating layer, the transparent electrode having an index of refraction less than the index of refraction of the grating layer; and
    a second grating layer having an index of refraction, the second grating layer disposed adjacent a bottom surface of the multiple quantum well structure.

2. The vertical cavity surface emitting laser diode of claim 1, further comprising a second transparent electrode adjacent a bottom surface of the second grating layer, the second transparent electrode having an index of refraction less than the index of refraction of the second grating layer.

3. The vertical cavity surface emitting laser diode of claim 2, wherein the first grating layer and the second grating layer each have an index of refraction from about 2.9 to about 3.5.

4. The vertical cavity surface emitting laser diode of claim 2, wherein the first transparent electrode and the second electrode each have an index of refraction from about 1.8 to about 2.3.

5. The vertical cavity surface emitting laser diode of claim 2, wherein the transparent electrode comprises a material selected from the group consisting of indium tin oxide, indium titanium oxide, and aluminum zinc oxide.

6. The vertical cavity surface emitting laser diode of claim 1, wherein the first and second grating layers each comprise a substantially solid transparent material.

7. The vertical cavity surface emitting laser diode of claim 1, wherein the second grating layer comprises a material having a plurality of equally spaced grooves.

8. A semiconductor diode, comprising
a first layer constructed of a substrate;
a second layer disposed adjacent to the first layer constructed of a material whose atomic structure is characterized by an excess of electrons;
an active layer disposed adjacent to the second layer;
a third layer disposed adjacent the active layer constructed of a material whose atomic structure is characterized by a relative absence of electrons;
a fourth layer disposed adjacent the third layer whose surface comprises an electrical current resisting material having an aperture disposed therein;
a fifth layer comprising a first grating layer having an index of refraction and a specified thickness disposed adjacent the fourth layer configured to transmit and/or reflect optical energy at a predetermined wavelength; and
a first transparent electrode having an index of refraction disposed adjacent the fifth layer configured to transmit and/or reflect optical energy and conduct electrical current;
wherein the active layer between the second and third layers generates energy in the form of photons by the migration of electrons from the second layer to the third layer upon application of an electric potential.

9. The semiconductor diode of claim 8, further comprising a plurality of reflective surfaces disposed adjacent a bottom surface of the active layer and a nontransparent electrode disposed adjacent a bottom surface of the plurality of reflective surfaces.

10. The semiconductor diode of claim 8, further comprising a sixth layer comprising a second grating layer disposed adjacent the first layer, wherein the first grating layer and the second grating layer are oriented on opposing sides of the first layer.

11. The semiconductor diode of claim 8, wherein the index of refraction of the first transparent electrode is less than the index of refraction of the first grating layer.

12. The semiconductor diode of claim 8, wherein the index of refraction of the first grating layer and the first transparent electrode is linear.

13. The semiconductor diode of claim 8, wherein the index of refraction of the first grating layer and the first transparent electrode is non-linear.

14. The semiconductor diode of claim 8, wherein the first grating layer ranges from about 0.9 to about 1.5 micrometers thick.

15. A method of manufacturing a laser diode, comprising:
providing a substrate;
applying a second layer disposed adjacent to the substrate, wherein the second layer is constructed of a material whose atomic structure is characterized by an excess of electrons;
applying an active layer to the second layer;
applying a third layer to the active layer, wherein the third layer is constructed of a material whose atomic structure is characterized by a relative absence of electrons;
applying a fourth layer to the third layer, wherein the fourth layer whose surface comprises an electrical current resisting material and has an aperture disposed thereon;
applying a first grating layer, having an index of refraction and a specified thickness, to a top surface of the fourth layer; and
applying a transparent electrode to a top surface of the first grating layer, wherein the transparent electrode has an index of refraction less than the index of refraction of the grating layer;
wherein the active layer between the second and third layers generates energy in the form of photons by the migration of electrons from the second layer to the third layer upon application of an electric potential.

16. The method of claim 15, further comprising the step of applying a second grating layer to a bottom surface of the active layer, wherein the second grating layer has an index of refraction.

17. The method of claim 16, further comprising the step of applying a second transparent electrode to a bottom surface of the second grating layer, the second transparent electrode having an index of refraction less than the index of refraction of the second grating layer.

* * * * *